United States Patent
Kasai

[11] Patent Number: 6,116,916
[45] Date of Patent: Sep. 12, 2000

[54] ELECTRICAL CONNECTION BOX

[75] Inventor: Koji Kasai, Yokkaichi, Japan

[73] Assignee: Sumitomo Wiring Systems, Ltd., Japan

[21] Appl. No.: 09/251,617

[22] Filed: Feb. 17, 1999

[30] Foreign Application Priority Data

Feb. 23, 1998 [JP] Japan .................................. 10-040651

[51] Int. Cl.⁷ .................................................. H05K 1/00
[52] U.S. Cl. .......................................... 439/76.2; 361/826
[58] Field of Search ................................. 439/76.2, 76.1, 439/621, 830; 361/826, 644, 736, 730, 642

[56] References Cited

U.S. PATENT DOCUMENTS

| | | | |
|---|---|---|---|
| 4,799,893 | 1/1989 | Ogawa et al. . | |
| 4,850,884 | 7/1989 | Sawai et al. . | |
| 4,959,018 | 9/1990 | Yamamoto et al. | 439/76.2 |
| 5,040,996 | 8/1991 | Kobold et al. | 439/76.2 |
| 5,204,805 | 4/1993 | Takashashi et al. | 439/76.2 |
| 5,509,812 | 4/1996 | Comerci et al. . | |
| 5,653,607 | 8/1997 | Saka et al. | 439/76.2 |
| 5,877,944 | 3/1999 | Onizuka | 439/76.2 |
| 5,895,277 | 4/1999 | Saka et al. | 439/76.2 |
| 5,902,138 | 5/1999 | Murakami | 439/76.2 |
| 5,928,004 | 7/1999 | Sumida et al. | 439/76.2 |
| 5,995,380 | 11/1999 | Maue et al. | 439/76.2 |
| 6,000,952 | 12/1999 | Gladd et al. | 439/76.2 |

FOREIGN PATENT DOCUMENTS

| | | |
|---|---|---|
| 0 782 216 | of 1997 | European Pat. Off. . |
| 9-261821 | of 1997 | Japan . |
| WO 94/29145 | of 1994 | WIPO . |

Primary Examiner—Brian Sircus
Assistant Examiner—J. F. Duverne
Attorney, Agent, or Firm—Anthony J. Casella; Gerald E. Hespos; Michael J. Porco

[57] ABSTRACT

A busbar 24 and a printed circuit board 23 having electronic devices mounted thereon are provided as internal circuits in a casing of an electrical connection box. Terminals 24a provided in the busbar 24 are inserted through the printed circuit board 23 to be secured to a conductive portion by solder 30 for a direct electrical connection.

9 Claims, 6 Drawing Sheets

ELECTRICAL CONNECTION BOX

BACKGROUND OF THE INVENTION

1. Field of the Invention

The present invention relates to an electrical connection box such as a junction box used for an automotive vehicle and is designed to make the electrical connection box smaller and lighter and to reduce the number of parts by making internal circuits accommodated in the electrical connection box highly functional.

2. Description of the Related Art

Internal circuits of a prior art electrical connection box, such as a junction box, typically are formed by busbars. A prior art busbar is formed by punching a conductive metal sheet and, in many cases, a plurality of such busbars are placed one over another with insulating plates held therebetween.

Busbars need to be newly worked in the case of a circuit change, and this reworking leads to an increase in production costs. Circuit change is necessitated relatively frequently on internal circuits of load side circuits downstream from a fuse. Consequently these internal circuits often are formed by wires (single-core wires) and cramping terminals to be pressingly connected with the wires. Further, a printed circuit board having electronic devices such as relays, diodes and capacitors mounted thereon may be provided in the prior art electrical connection box.

A known highly functional electrical connection box is shown in FIG. 5, and has upper and lower casings 1 and 2. Busbars 3 and insulating plates 4 are laminated in a laminated portion 5. The laminated portion 5 and a printed circuit board 6 are accommodated in different levels in a casing comprised of the upper casing 1 and the lower casing 2. The busbars 3 and the printed circuit board 6 are connected via connectors 7 which are intermediate parts. Each connector 7 has a connector housing 7a mounted on an outer edge of the printed circuit board 6. Male terminals 3a in the form of tabs are formed by bending the busbars 3. The male terminals 3a are inserted into the respective terminal chambers of the connector housing 7a, and are connected with female terminals 7b set in the connector housing 7a. The female terminals 7b and a conductive portion of the printed circuit board 6 are connected as follows. Ends of a circuit portion arranged on the rear surface of the insulating board 6a of the printed circuit board 6 are extended to the outer edges of the printed circuit board 6. A copper leaf or area is exposed only at leading ends 8 of the circuit portion which are aligned. An electrical connection then is established by holding the leading ends 8 of the circuit portion by the female terminals 7b.

In an electrical connection box shown in FIG. 6 and FIG. 7, a busbar 3, a printed circuit board 6 and an internal circuit formed by single-core wires 9 and cramping terminals 10 are accommodated at different levels in a casing comprised of an upper casing 1 and a lower casing 2. In this electrical connection box, hollow box-shaped female intermediate terminals 11 are provided on the printed circuit board 6. A pair of leg portions 11a project from the bottom ends of the intermediate terminals 11 and are inserted through holes 6b formed in the insulating board 6a of the printed circuit board 6. The leg portions 11a are mounted at the lower surface side of the insulating plate 6a and are connected with a conductive portion via solder 12 as shown in FIGS. 7(A) and 7(B). Tab-shaped male terminals 3a of the busbars 3 and tab-shaped male terminals 10a of the cramping terminals 10 that connect with the single-core wires 9 are inserted into the intermediate terminals 11 for electrical connection.

In the electrical connection box shown in FIG. 5, the busbar terminals 3a and the conductive portion of the printed circuit board 6 are connected via the connectors 7 as the intermediate parts. Hence the number of parts and the number of assembling steps are increased, thereby increasing costs for parts, assembling and maintenance and accordingly production costs. Likewise, the cramping terminals 10 connected with the single-core wires 9 and the busbar terminals 3a are connected with the conductive portion of the printed circuit board 6 via the intermediate terminals 11 in the electrical connection box shown in FIGS. 6 and 7. Thus the number of parts and the number of assembling steps are increased, thereby increasing costs for parts, assembling and maintenance and accordingly production costs.

Further, the use of the connectors 7 and the intermediate terminals 11 as the intermediate parts necessitates a space for providing them and makes the electrical connection box larger and heavier. Therefore, it is difficult to make the electrical connection box compact for a high density arrangement.

In view of the above problems, it is an object of the invention to provide an electrical connection box having an improved space efficiency and a reduced number of mounting steps.

SUMMARY OF THE INVENTION

According to the invention, there is provided an electrical connection box in which at least one printed circuit board having electric and/or electronic devices mounted thereon and at least one busbar are accommodated in substantially different levels in a casing. One or more terminals projecting from the busbar are soldered and/or bonded to a corresponding conductive portion of the printed circuit board for a direct electrical connection.

Such an electrical connection box improves a connection mode of a printed circuit board with busbars and cramping terminals to be accommodated in an electrical connection box, thereby making it unnecessary to use connectors, intermediate terminals and like intermediate parts, which are required in the prior art. This reduces the number of parts and the number of assembling steps, so that production costs can be reduced and the electrical connection box can be made more highly functional, smaller and lighter.

If the terminals projecting from the busbar are directly soldered or bonded (e.g. by ultrasonic waves or heat) to the conductive portion of the printed circuit board as described above, connectors, intermediate terminals or like intermediate parts which are required in the prior art can be dispensed with.

According to a preferred embodiment of the invention, an insulating plate is at least partially provided between the printed circuit board and the busbar. One or more insulating plate through holes are formed in the insulating plate. Terminals projecting from the busbar are inserted or insertable through the insulating plate through holes. Accordingly, the circuit board and/or the busbar can be formed with non-insulated circuit paths, since a danger of short circuits of one element by the other is prevented by the insulating plate disposed therebetween.

Preferably, one or more board through holes are formed in the printed circuit board; and the terminals projecting from the busbar are inserted or insertable through the board through holes.

Further preferably, portions of the terminals projecting from the board through holes of the printed circuit board are soldered and/or bonded for electrical connection with the conductive portion of the printed circuit board.

Most preferably, portions of the terminals project from the board through holes of the printed circuit board and project into one or more connector receptacles in the casing for electrical connection to a mating connector. Specifically, an insulating plate is provided between the printed circuit board and the busbar. Through holes are formed in the insulating plate and the printed circuit board. The terminals that project from the busbar are inserted through the through holes. Portions of the terminals that project from the through holes of the printed circuit board are soldered into connection with the conductive portion of the printed circuit board.

According to a further preferred embodiment, cramping terminals have a first end connected with wires and a second end is soldered and/or bonded to the conductive portion of the printed circuit board for a direct electrical connection. The internal circuit comprising cramping terminals connected with wires is accommodated in a different level in the casing than the end of each cramping terminal that is soldered to the conductive portion of the printed circuit board for a direct electrical connection.

The use of intermediate parts is avoided by directly connecting the cramping terminals with the wires and with the printed circuit board. This reduces the number of parts and the number of assembling steps and makes a space for the intermediate parts unnecessary. As a result, the electrical connection box can be made smaller and lighter.

Preferably, one or more auxiliary cramping terminals connected or connectable to the wires projects into one or more connector receptacles that are provided on the casing for connection with a mating connector.

Most preferably, an internal circuit insulating plate is arranged substantially between the busbar and the internal circuit. The internal circuit insulating plate has terminal holes for the insertion of the cramping terminals therethrough.

These and other objects, features and advantages of the present invention will become more apparent upon a reading of the following detailed description and accompanying drawings.

DETAILED DESCRIPTION OF THE PREFERRED EMBODIMENTS

Figure 1:
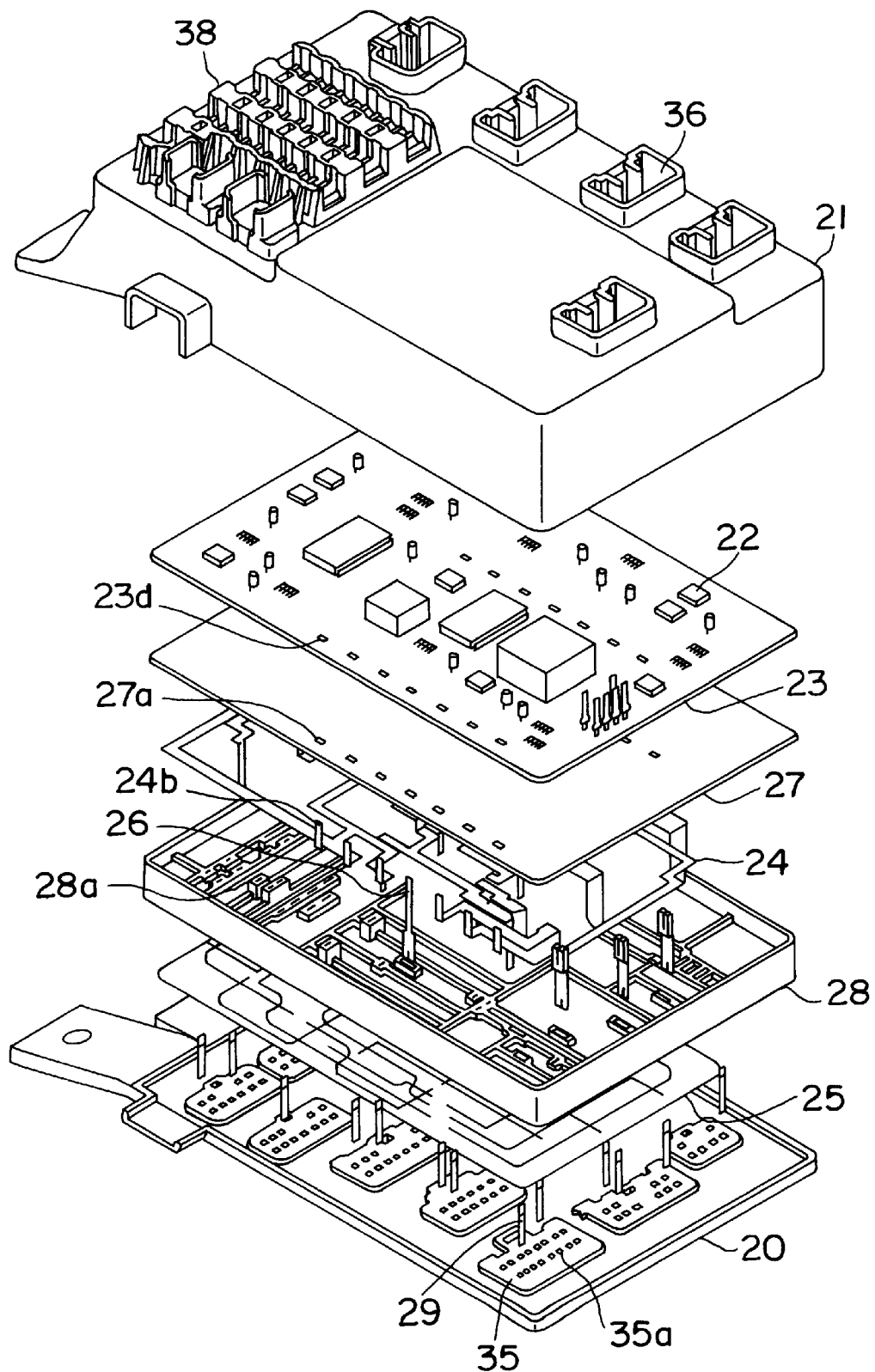
FIG. 1 is an exploded perspective view of an electrical connection box according to one embodiment of the invention.
Figure 2:
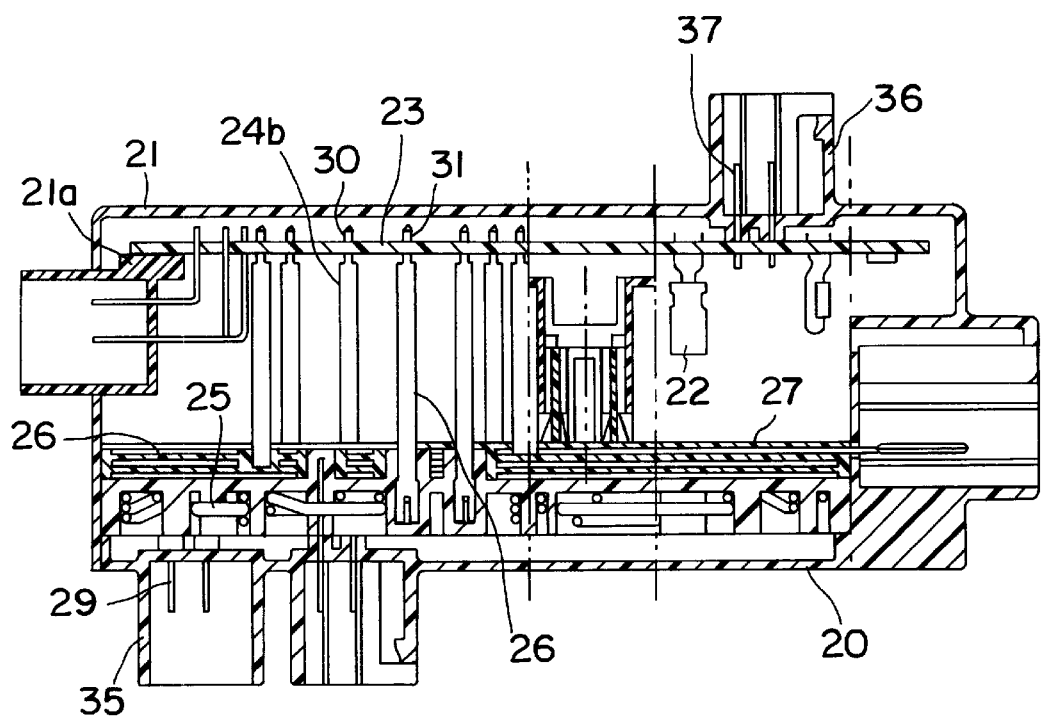
FIG. 2 is a section of the electrical connection box in its assembled state.
Figure 3:
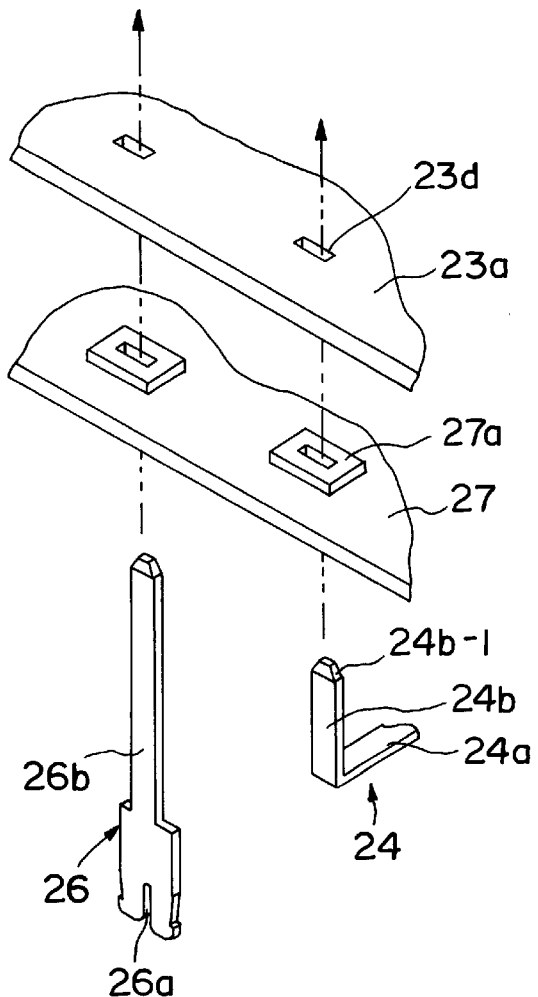
FIG. 3 is an enlarged exploded view of an essential portion.
Figure 4:
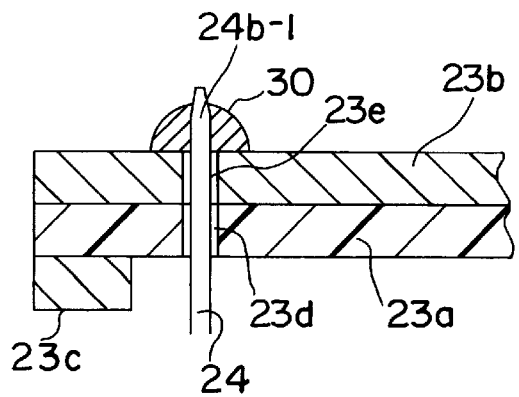
FIG. 4 is a section showing a state where a busbar and a cramping terminal are connected with a printed circuit board.
Figure 5:
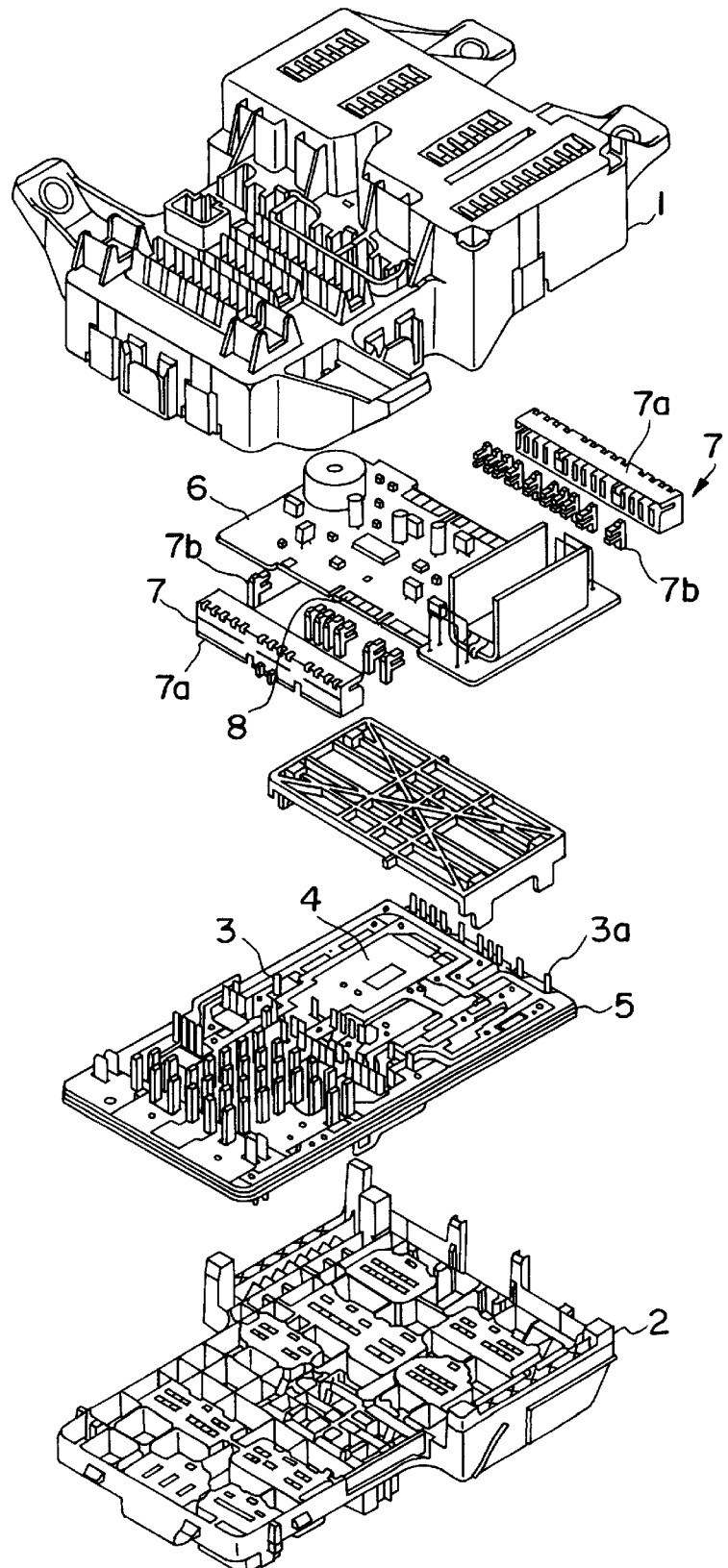
FIG. 5 is an exploded perspective view of a prior art electrical connection box.
Figure 6:
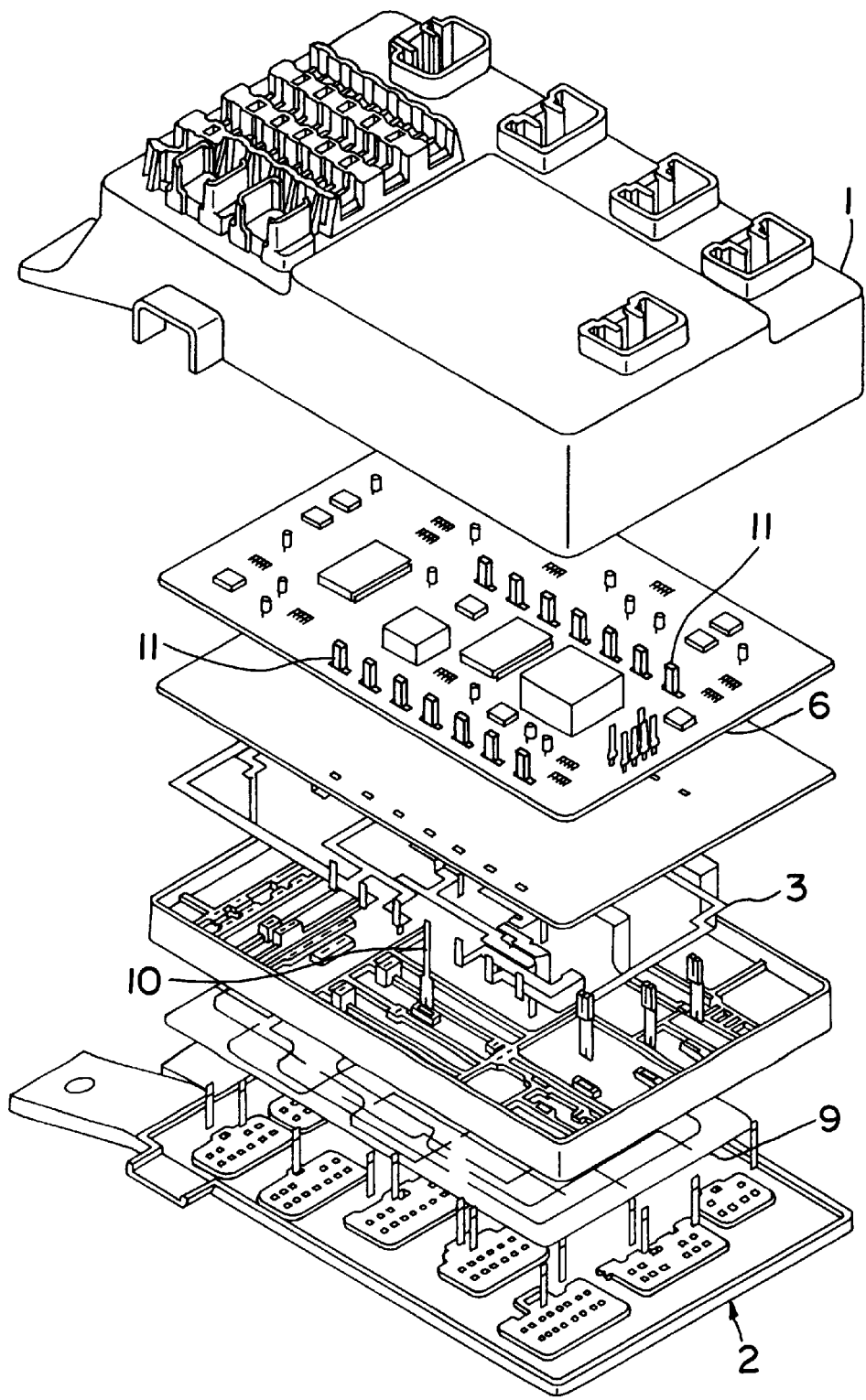
FIG. 6 is an exploded perspective view of another prior art electrical connection box.
Figure 7A:
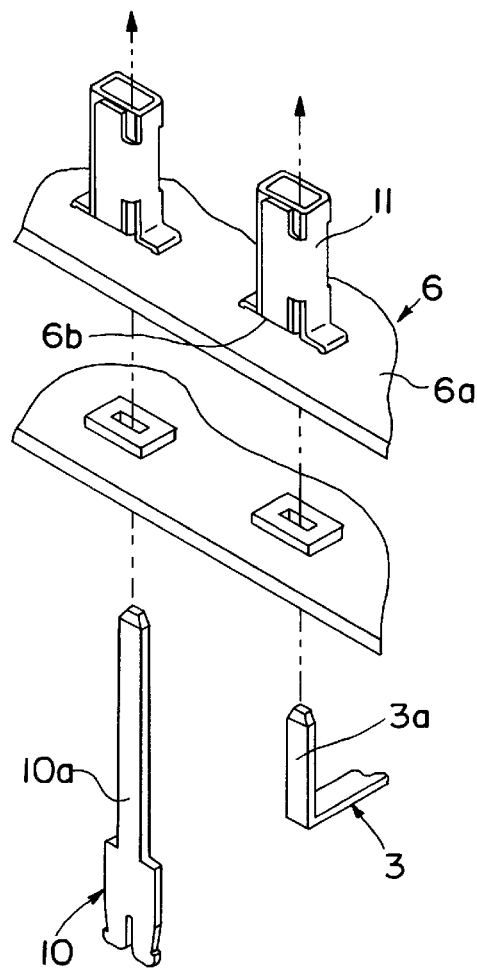
FIG. 7(A) is an exploded perspective view of an essential portion of FIG. 6.
Figure 7B:
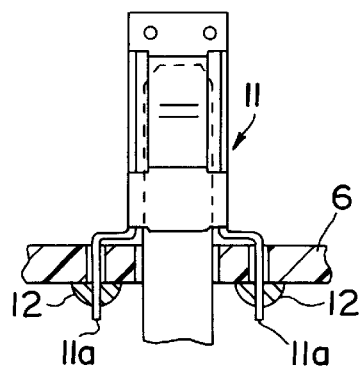
FIG. 7(B) is a section of the essential portion in its assembled state.

An electrical connection box in accordance with the subject invention is illustrated in FIGS. 1 to 4. The electrical connection box includes three kinds of internal circuits, namely, a printed circuit board 23 having electric and/or electronic devices 22 mounted thereon, at least one busbar 24, and a combination of single-core wires 25 and cramping terminals 26. The internal circuits of the electrical connection box are accommodated in a casing comprised of lower and upper casings 20, 21 and insulating plates 27, 28 provided between the respective kinds of internal circuits.

The single-core wires 25 are arranged on or at the upper surface of the lower casing 20, and bottom blade portions 26a of the cramping terminals 26 are connected or connectable with the single-core wires 25. The insulating plate 28 for the single-core wires 25 is arranged above the single core-wires 25, and the busbar 24 is arranged on the upper surface of the insulating plate 28. The insulating plate 27 is arranged above the busbar 24 and the printed circuit board 23 is arranged above the insulating plate 27. The upper casing 21 is placed above the printed circuit board 23 to substantially close the electrical connection box.

The printed circuit board 23 has its opposite ends placed on preferably step-shaped locking portions 21a formed on the inner surfaces of the side walls of the upper casing 21 so as to extend substantially horizontally (or to extend in a direction substantially parallel to the plane of the circuit board 23 or an arrangement plane) inside the electrical connection box. Conductive portions 23b, 23c are printed on the upper and lower surfaces of an insulating board 23a of the printed circuit board 23, and electronic devices 22 mounted on the lower surface (FIG. 2) and/or upper surface (FIG. 1) are connected with the conductive portion 23c on the lower surface. Further, through holes are formed as terminal holes 23d, 23e in specified (predetermined or predeterminable) positions of the insulating board 23a and the conductive portion 23b of the printed circuit board 23.

Through holes are also formed as terminal holes 27a in specified (predetermined or predeterminable) positions of the insulating plate 27 provided between the printed circuit board 23 and the busbar 24, and as terminal holes 28a in specified (predetermined or predeterminable) positions of the insulating plate 28 provided between the busbar 24 and the single-core wires 25.

Male terminals 24b in the form of upright tabs are formed in specified positions of the busbar 24 by bending horizontal portions (or portions substantially parallel to the arrangement plate) 24a. The male terminals 24b are inserted or insertable through the terminal holes 23d of the printed circuit board 23 after being inserted through the terminal holes 27a of the insulating plate 27. Leading ends 24b-1 of the male terminals 24b projecting from the upper surface of the printed circuit board 23 are directly electrically connected with the conductive portion 23b on the upper surface of the printed circuit board 23 by solder 30. Alternatively or additionally the leading ends 24b-1 of the male terminals 24 may be bonded to the corresponding conductive portions 23b of the printed circuit board 23 e.g. by ultrasonic and/or heat bonding.

The leading end 24b-1 may be tapered or thinned or slanted so as to be more easily inserted or insertable into or positioned with respect to the terminal holes (23d, 23e, 27a and/or 28a).

Further, preferably upwardly projecting tab-shaped male terminals 26b of the cramping terminal 26 connected with the single-core wires 25 are inserted or insertable through the terminal holes 28a of the insulating plate 28 and the terminal holes 27a of the insulating plate 27 and further through the terminal holes 23d of the printed circuit board 23. Portions of the male terminals 26b projecting from the upper surface of the printed circuit board 23 are connected or may be connected directly with the conductive portion 23b on the e.g. upper surface of the printed circuit board 23 preferably by solder 31.

Cramping terminals 29 having preferably downwardly projecting tabs are connected or connectable with the single-core wires 25. These tabs are caused to project from terminal holes 35a formed in connector receptacles 35 provided on the lower casing 20 for connection with external connectors (not shown). Further, connector receptacles 36 are provided on the upper casing 21 to connect external connectors (not shown) and the internal circuits inside the casing via terminals 37, connected with printed circuit board 23 e.g. by soldering. Further, relay and/or fuse (or other electric or electronic device) mount portions 38 are provided to connect relays and fuses or other electric or electronic device (not shown) with the internal circuits.

In the electrical connection box thus constructed, the busbar 24 and the printed circuit board 23, the cramping terminals 26 and the printed circuit board 23 accommodated in the casing comprised of the lower and upper casings 20, 21 can be directly electrically connected without using intermediate parts such as connectors and intermediate terminals.

The terminal holes 23d, 23e 27a and/or 28a are provided in such positions so as to substantially correspond to or mate with parts or portions of the busbar 24 and/or cramping terminals 29, which are thus arrangeable therethrough.

As is clear from the above description, in the electrical connection box according to the invention, the printed circuit board having electronic devices mounted thereon is connected or connectable directly and electrically with the busbar and the cramping terminals as other internal circuits of the electrical connection box without using any intermediate parts. Accordingly, the number of parts and the number of assembling steps can be reduced, with the results that production costs can be reduced considerably.

Further, since the internal circuits, that is the printed circuit board, the busbar, the single-core wires and the cramping terminals, are combined and arranged in different levels, they can be accommodated efficiently in the electrical connection box. Since the intermediate parts for connecting the internal circuits are not necessary, the electrical connection box can be made smaller and lighter by eliminating a space for the intermediate parts.

Furthermore, since a plurality of kinds of internal circuits are used, internal circuits corresponding to amounts of power applied can be used selectively and it is easy to respond to a circuit change.

What is claimed is:

1. An electrical connection box comprising: a casing; a printed circuit board disposed at a first level in the casing, conductive portions disposed on the printed circuit board, electronic devices mounted on the printed circuit board and connected to the conductive portions, at least one board through hole being formed in the printed circuit board at a location on the printed circuit board having the conductive portion; an insulating plate defining a second level in the casing, the insulating plate having at least one insulating plate through hole substantially aligned with the board through hole in the printed circuit board; and at least one busbar accommodated at a third level in the casing such that the insulating plate is disposed between the printed circuit board and the busbar, at least one terminal projecting unitarily from the busbar, the terminal extending through the insulating plate through hole and through the board through hole and being electrically connected directly to a selected one of the conductive portions of the printed circuit board.

2. An electrical connection box according to claim 1, wherein the circuit board includes at least one board through hole spaced from the conductive portions, the casing having at least one connector receptacle aligned with the board through hole, the busbar having at least one terminal projecting through the board through holes of the printed circuit board and into the connector receptacle formed in the casing so as to be connected to a mating connector.

3. An electrical connection box according to claim 1, further comprising an internal circuit comprising at least one wire and at least one cramping terminal, the cramping terminal having a first end connected with the wire and a second end electrically connected directly to a selected one of the conductive portions of the printed circuit board.

4. A connector according to claim 3, further comprising at least one auxiliary cramping terminal connected to the wire and projecting into at least one connector receptacle provided on the casing for connection with a mating connector.

5. A connector according to claim 4, wherein an internal circuit insulating plate is arranged substantially between the busbar and the internal circuit, the internal circuit insulating plate having terminal holes for insertion of the cramping terminals therethrough.

6. A connector according to claim 3, wherein the second end of the cramping terminal is connected to the printed circuit board by solder.

7. A connector according to claim 6, wherein the portions of the terminals projecting from the board through holes of the printed circuit board are connected with the conductive portion of the printed circuit board by solder.

8. A connector according to claim 3, wherein the second end of the cramping terminal is connected to the printed circuit board by bonding.

9. A connector according to claim 8, wherein the portions of the terminals projecting from the board through holes of the printed circuit board are connected with the conductive portion of the printed circuit board by bonding.

* * * * *